(12) United States Patent
Leconte et al.

(10) Patent No.: US 7,046,577 B2
(45) Date of Patent: May 16, 2006

(54) NEGATIVE VOLTAGE WORD LINE DECODER, HAVING COMPACT TERMINATING ELEMENTS

(75) Inventors: Bruno Leconte, Rousset (FR); Sebastien Zink, Aix En Provence (FR); Paola Cavaleri, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 127 days.

(21) Appl. No.: 10/760,631

(22) Filed: Jan. 20, 2004

(65) Prior Publication Data

US 2004/0230736 A1 Nov. 18, 2004

(30) Foreign Application Priority Data

Jan. 21, 2003 (FR) .................................. 03 00615

(51) Int. Cl.
*G11C 8/00* (2006.01)

(52) U.S. Cl. .............................. 365/230.06; 365/230.02

(58) Field of Classification Search ........... 365/230.06, 365/230.02
See application file for complete search history.

(56) References Cited

U.S. PATENT DOCUMENTS

| 5,825,205 | A | 10/1998 | Ohtsuka ....................... 326/81 |
| 6,426,908 | B1 * | 7/2002 | Hidaka ........................ 365/222 |
| 6,741,515 | B1 * | 5/2004 | Lazar et al. ................. 365/222 |
| 6,747,903 | B1 * | 6/2004 | Pan et al. ............... 365/189.01 |
| 2002/0067639 | A1 | 6/2002 | Byeon et al. .......... 365/185.11 |

FOREIGN PATENT DOCUMENTS

| EP | 1 255 254 A2 | 11/2002 |
| WO | WO 02/41322 A1 | 5/2002 |

* cited by examiner

*Primary Examiner*—Michael Tran
(74) *Attorney, Agent, or Firm*—Lisa K. Jorgenson; Robert Iannucci; Seed IP Law Group PLLC

(57) ABSTRACT

An address decoder selectively applies to word lines of a memory array individual signals of variable polarity, negative or positive, the value of which varies according to a word line address applied to the decoder. The decoder comprises a group decoder delivering signals for selecting a group of word lines of variable polarity, at least one subgroup decoder delivering signals for selecting a subgroup of word lines of variable polarity, and word line drivers each comprising means for multiplexing the group and subgroup selection signals, for selecting and selectively applying one of these signals to a word line. Advantages: reduction in the size of the terminating elements of the decoders in relation with the reduction of the technological pitch in Flash memories.

38 Claims, 7 Drawing Sheets

NEGATIVE VOLTAGE WORD LINE DECODER, HAVING COMPACT TERMINATING ELEMENTS

BACKGROUND OF THE INVENTION

1. Field of the Invention

The present invention relates to a selective negative voltage word line decoder, particularly for Flash memory.

2. Description of the Related Art

More particularly, the present invention aims to provide an improvement of a decoder of the type described in application WO 02/41322 (FIGS. 5 and 6), allowing negative erase voltages to be selectively applied to word lines of a memory array, and thus page erasable Flash memories to be produced, one page representing one word line.

FIG. 1 very schematically represents a Flash memory array MA and a word line decoder WLDEC1 of the type described in the above-mentioned application. The memory array MA comprises floating-gate transistors FGT arranged in lines and in columns, each forming a non-volatile memory cell. The transistors FGT have their control gates linked to word lines WLi and their sources or their drains linked to bit lines BLk.

The decoder WLDEC1 comprises a predecoder PREDEC and a postdecoder POSTDEC powered by a voltage Vcc, supplying signals SELi for selecting word lines. When a determined address ADR is supplied to the decoder, the signal SELi for selecting the word line WLi designated by this address is set to 1 (voltage Vcc) while all the other selection signals are on 0 (ground). The signals SELi are applied to voltage adaptor circuits ADi each delivering a voltage Vi to a word line WLi. Each voltage adaptor ADi also receives a signal ERASE, a voltage VPOS and a voltage VNEG. The voltage Vi can be positive, negative or zero according to the operation being executed, the value of the selection signal SELi and the value of the voltages VPOS, VNEG.

As described by table 1 below, the signal ERASE is on 1 in the erase mode and on 0 in the other operating modes of the memory. The voltage VPOS is equal to a read voltage VREAD in the read mode, to a programming voltage VPP in the programming mode and to an erase inhibit voltage VEINHIB in the erase mode. The voltage VNEG is equal to a non-read voltage VNREAD in the read mode, to a programming inhibit voltage VPINHIB in the programming mode and to a negative erase voltage VER in the erase mode.

FIG. 2 represents the architecture of a voltage adaptor ADi. The adaptor ADi comprises a gate G1 of EXCLUSIVE OR type receiving the signals SELi and ERASE at input and delivering a signal COM. The signal COM is applied to an inverting gate G2 delivering a signal NCOM. The gates G1, G2 are powered by the voltage VPOS and the signals COM, NCOM are taken to the voltage VPOS when they are on 1. The signals COM and NCOM are applied to a driver stage 2 the output of which controls an inverting stage 3. The driver stage 2 comprises two branches in parallel each comprising a PMOS transistor in series with an NMOS transistor, respectively T0, T1 and T2, T3. The sources of the transistors T0 and T2 receive the voltage VPOS while the sources of the transistors T1 and T3 receive the voltage VNEG. The drain node of the transistors T2, T3 is connected to the gate of the transistor T1 and the drain node of the transistors T0, T1 is connected to the gate of the transistor T3. The inverting stage 3 comprises a PMOS transistor T4 in series with an NMOS transistor T5. The source of the transistor T4 receives the voltage VPOS and the source of the transistor T5 receives the voltage VNEG. The gates of the transistors T4, T5 are linked to the drain node of the transistors T2, T3, and the drain node of the transistors T4, T5 supplies the voltage Vi. The NMOS transistors T1, T3 and T5 are produced in a P-type well WP isolated from the substrate by an N-well, according to the known triple well technique.

The transfer function of the voltage adaptors ADi is described by table 1 below. In the page erase mode (ERASE=1) the voltage Vi applied to a word line WLi is equal to VER if the word line is selected (SELi=1) or to VEINHIB if the word line is not selected (SELi=0), the voltage VEINHIB here being equal to 4V. Outside periods of erasing, the voltage Vi applied to a selected word line WLi is equal to the voltage VPOS and the voltage Vi applied to a non-selected word line WLi (SELi=0) is zero.

TABLE 1

| Mode | SELi | ERASE | COM | NCOM | Vi |
|---|---|---|---|---|---|
| Read | 0 | 0 | 0 | 1 | Vi = VNEG = VNREAD = 0 V (GND) |
|  | 1 | 0 | 1 | 0 | Vi = VPOS = VREAD = 4.5 V |
| Programming | 0 | 0 | 0 | 1 | Vi = VNEG = VPINHIB = 0 V (GND) |
|  | 1 | 0 | 1 | 0 | Vi = VPOS = VPP (8–10 V) |
| Erase | 0 | 1 | 1 | 0 | Vi = VPOS = VEINHIB (4 V) |
|  | 1 | 1 | 0 | 1 | Vi = VNEG = VER (−8 V) |

This negative voltage decoder, although being fully satisfactory per se, has the disadvantage that the voltage adaptors ADi, which form the terminating elements of the decoder, are of a relatively complex structure.

Now, with the developments in manufacturing methods of Flash memories, the technological pitch of the memories, that is the minimum distance between two word lines, is increasingly reduced. It thus becomes apparent that the surface of silicon available opposite each word line WLi becomes too small to allow voltage adaptors having the structure described above to be integrated.

BRIEF SUMMARY OF THE INVENTION

Thus, an embodiment of the present invention provides a selective negative voltage word line decoder structure that is compatible with the reduction in the technological pitch in non-volatile memories, particularly Flash memories.

More particularly, one embodiment of the present invention provides a selective negative voltage word line decoder structure that comprises compact terminating elements.

One embodiment of the present invention provides an address decoder for selectively applying to word lines of a memory array signals of variable polarity, negative or positive, the value of which varies according to a word line address applied to the decoder, comprising a group decoder delivering signals for selecting a group of word lines that are of variable polarity, at least one subgroup decoder delivering signals for selecting a subgroup of word lines that are also of variable polarity, one subgroup of word lines comprising a set of word lines belonging to different groups of word lines, and word line drivers with one word line driver per word line, each comprising means for multiplexing the group and subgroup selection signals, for selecting and selectively applying one of these signals to a word line.

According to one embodiment, a group of word lines comprises a set of word lines having address bits of identical determined significance, and a subgroup of word lines comprises a set of word lines having address bits of identical determined significance, while belonging to different groups of word lines.

According to one embodiment, a group of word lines comprises a set of word lines having identical most significant address bits, and a subgroup of word lines comprises a set of word lines having identical least significant address bits.

According to one embodiment, a word line driver comprises MOS-type switch transistors which are both driven on their gate and biased on their drain and their source by the group and subgroup selection signals, and are arranged for selecting one of these signals and for applying it to a word line.

According to one embodiment, a word line driver comprises switch transistors each having a terminal linked to a word line, a terminal receiving a group or subgroup selection signal, and a gate receiving a group or subgroup selection signal.

According to one embodiment, the subgroup decoder comprises a first subgroup decoder, delivering first subgroup selection signals the value of which varies according to the word line address applied to the decoder during phases of erasing memory cells, and is independent of the address applied to the decoder during phases of reading or programming memory cells; and a second subgroup decoder delivering second subgroup selection signals the value of which varies according to the word line address applied to the decoder during the phases of reading or programming, and is independent of the address applied to the decoder during the phases of erasing.

According to one embodiment, each of the subgroup decoders receives a first and a second reference voltage and supplies, in addition to a subgroup selection signal, a complementary subgroup selection signal equal to the second reference voltage when the subgroup selection signal is equal to the first reference voltage and equal to the first reference voltage when the subgroup selection signal is equal to the second reference voltage.

According to one embodiment, a word line driver comprises MOS transistors the gates of which are driven by one of the complementary signals, and MOS transistors the gates of which are driven by group selection signals.

According to one embodiment, a word line driver comprises a first MOS transistor having a drain or source terminal linked to a word line, receiving a group selection signal at its gate and receiving a first subgroup selection signal at a source or drain terminal, a second MOS transistor having a drain or source terminal linked to the word line, receiving the group selection signal at its gate and receiving a second subgroup selection signal at a source or drain terminal, a third MOS transistor having a drain or source terminal linked to the word line, receiving a first complementary subgroup selection signal at its gate and receiving a second subgroup selection signal at a source or drain terminal, and a fourth MOS transistor having a drain or source terminal linked to the word line, receiving a second complementary subgroup selection signal at its gate and receiving a first subgroup selection signal at a source or drain terminal.

According to one embodiment, the group and subgroup decoders receive two reference voltages that are respectively equal to a non-read voltage and a read voltage during the reading of memory cells.

According to one embodiment, the group and subgroup decoders receive two reference voltages that are respectively equal to a programming inhibit voltage and a programming voltage during the programming of memory cells.

According to one embodiment, the group and subgroup decoders receive two reference voltages that are respectively equal to an erase voltage and to an erase inhibit voltage during the erasing of memory cells.

According to one embodiment, the programming voltage is positive, the programming inhibit voltage and the erase voltage are negative, the non-read and erase inhibit voltages are zero.

According to one embodiment, the decoder comprises a predecode stage supplying predecoding signals to the group and subgroup decoders.

According to one embodiment, the group decoder and the subgroup decoder supply positive, negative or zero selection signals.

According to one embodiment, the group decoder comprises voltage elevator circuits for transforming a logic signal equal to 1 having a determined positive level of voltage into a logic signal having a higher positive level of voltage, equal to a reference voltage supplied to the voltage elevator circuits.

According to one embodiment, the group and subgroup decoders comprise voltage selector switches for transforming logic signals on 0 and on 1 into signals having different negative levels of voltage.

According to one embodiment, the group and subgroup decoders comprise voltage selector switches arranged for transforming a logic signal on 0 into a negative voltage signal and a logic signal on 1 into a positive voltage signal.

BRIEF DESCRIPTION OF THE DRAWINGS

These features and advantages of the present invention will be explained in greater detail in the following description of an example of an embodiment of a decoder according to the present invention, given in relation with, but not limited to, the following figures.

DETAILED DESCRIPTION OF THE INVENTION

Figure 1:
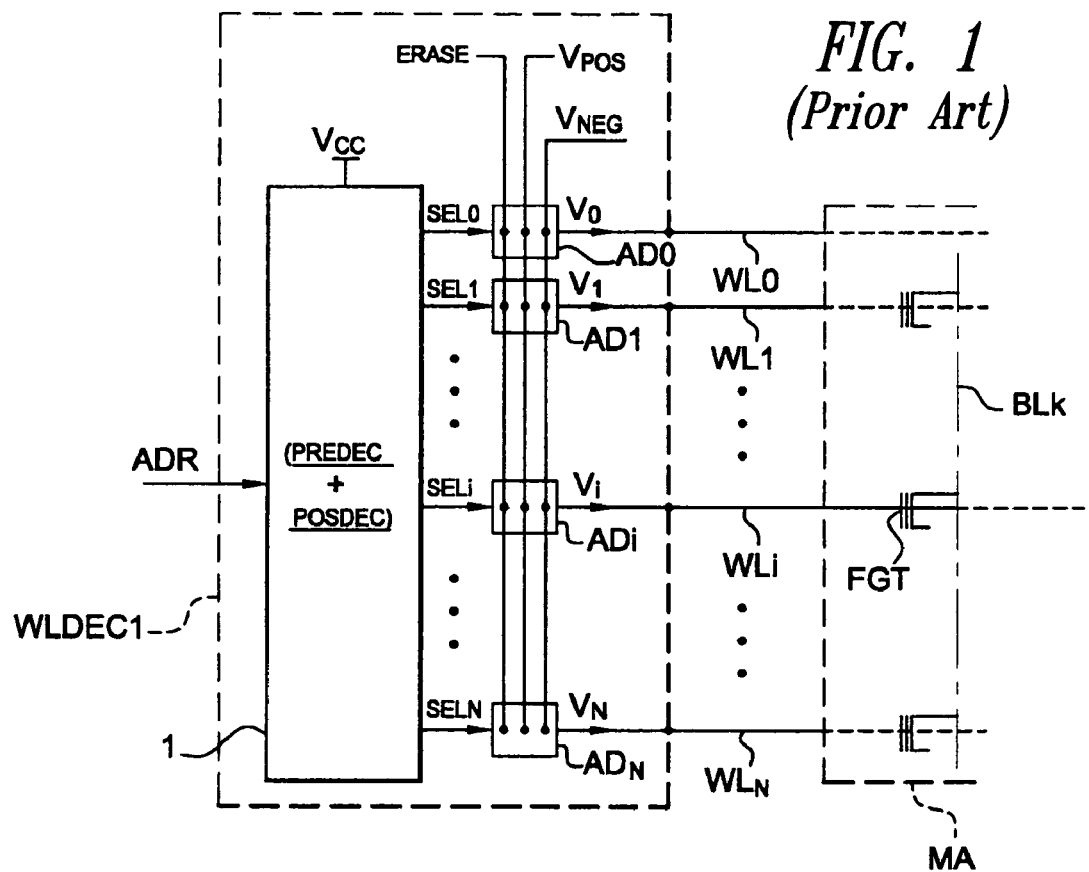
FIG. 1 described above represents the general structure of a classical negative voltage word line decoder.
Figure 2:
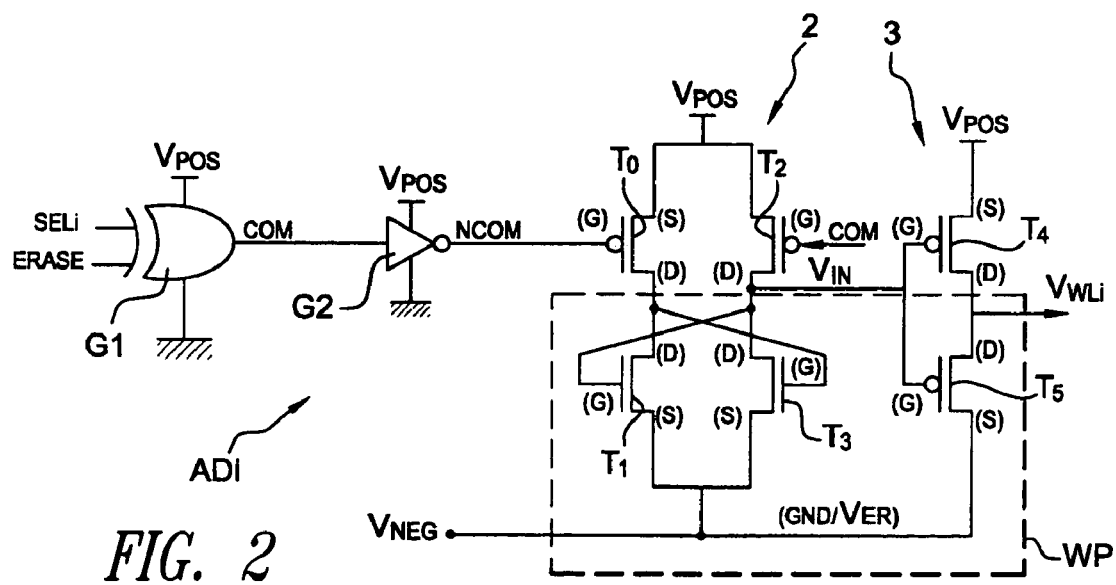
FIG. 2 represents the structure of a voltage adaptor present in the decoder in FIG. 1.
Figure 3A:
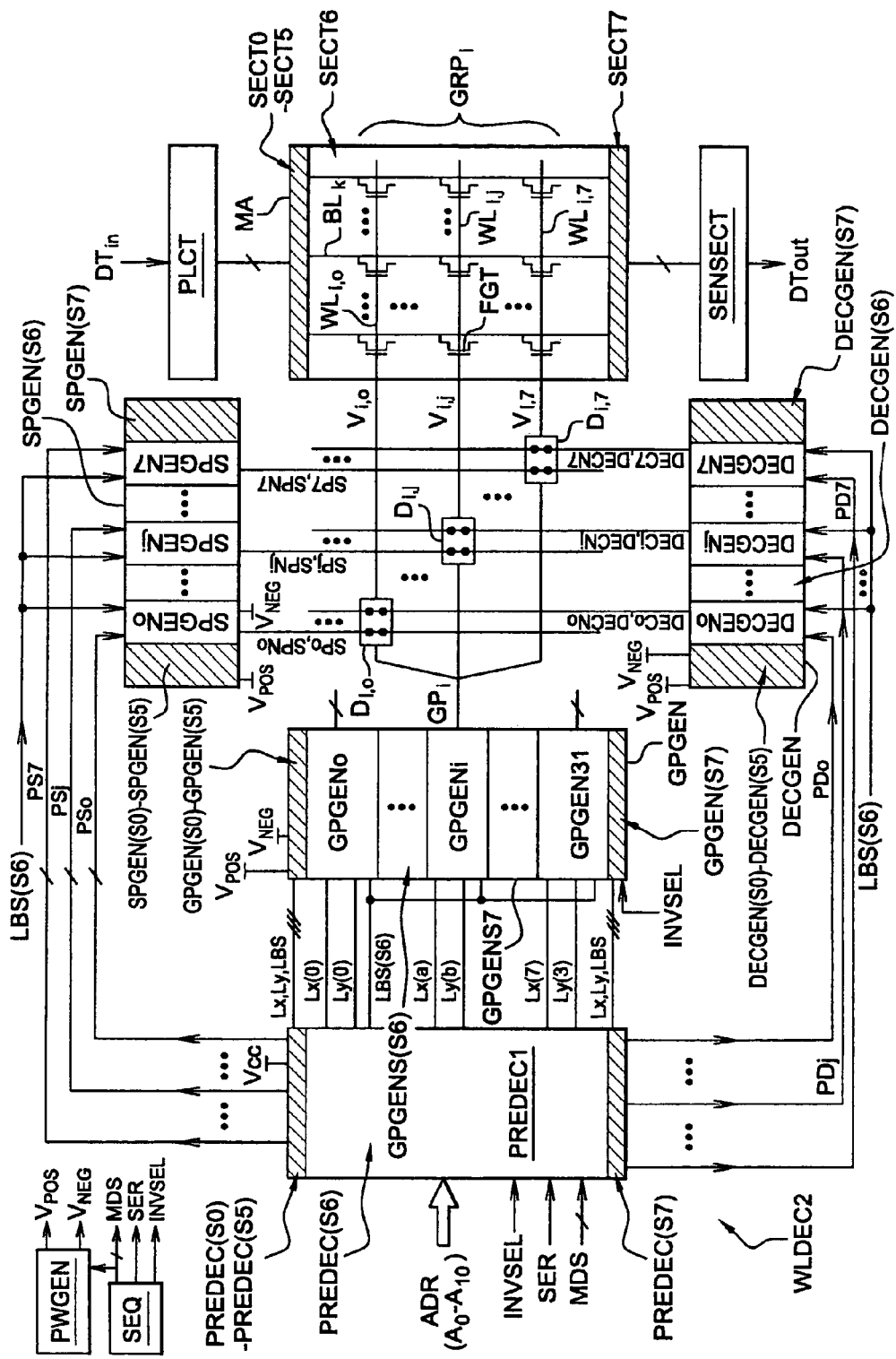
FIG. 3A represents the general structure of a word line decoder according to the present invention, integrated into a Flash memory.

FIG. 3A is a general diagram of a Flash memory comprising a word line decoder WLDEC2 according to one embodiment of the present invention and a Flash memory array MA. The decoder WLDEC2 here receives a word line address ADR coded on 11 bits A0 to A10. The memory array MA comprises word lines WLi,j, bit lines BLk (i, j, k being indices) and floating-gate transistors FGT. Each transistor FGT has a gate connected to a word line and a drain or source terminal connected to a bit line, and forms an electrically erasable and programmable memory cell. The bit lines BLk are linked to a programming circuit PLCT and to a read circuit SENSECT. The circuit PLCT comprises programming latches, for receiving data DTin to be logged in the memory cells during a programming phase. The read circuit SENSECT comprises sense amplifiers for reading data DTout in the memory cells during a read phase.

Organization of the Memory Array

The memory array here comprises 8 sectors SCT0 to SCT7 designated by the 3 most significant address bits A0–AA2, and each sector comprises 256 word lines (only the sector SCT6 being represented partially). This breakdown into sectors is however optional and is only described here as a concrete example of implementation of the present invention.

The architecture of the decoder WLDEC2 is based on a breakdown of each sector (or of the entire memory array if a single sector is provided) into groups of word lines and into subgroups of word lines, such that the intersection of a group of word lines and of a subgroup of word lines corresponds to one and only one word line.

Therefore the breakdown is here as follows:
  the 5 most significant address bits A3–A7 designate a group of word lines, and
  the 3 least significant address bits A8–A10 designate a subgroup of word lines.

Naturally, the most significant address bits A0–A2 would be bits designating a group if the memory array did not comprise any sectors.

Each sector thus comprises 32 groups of 8 word lines and 8 subgroups of 8 word lines, and each group comprises 8 word lines that each belong to one of the 8 subgroups, a subgroup only comprising word lines belonging to different groups. In the description below, a group is designated GRPi and the rank of a group designated by the index "i", the rank of a subgroup being designated by the index "j". A word line belonging to a group of rank i and to a subgroup of rank j is designated WLi,j. As an example, FIG. 3A represents the word lines WLi,0 . . . WLi,j . . . WLi,7 of a group, GRPi of rank i of the sector SCT6 (the index i here being between 0 and 31).

Architecture of the Decoder WLDEC2

The decoder WLDEC2 has an architecture corresponding to the breakdown of the memory array into groups and into subgroups, and comprises:
  a predecoder PREDEC1 powered by a voltage Vcc,
  a group decoder GPGEN,
  two subgroup decoders DECGEN, SPGEN,
  word line drivers Di,j, with one driver Di,j per word line, each word line driver supplying a voltage Vi,j to a word line WLi,j of corresponding rank.

Predecoder PREDEC1

The predecoder PREDEC1 supplies group selection signals Lx(a), Ly(b), LBS to the group decoder GPGEN.

The signal LBS varies according to the 3 most significant address bits A0–A2 and is identical for all the groups of word lines of a same sector. If, for example, the address bits A0–A2 designate the sector SECT6, the signal LBS(S6) supplied by the predecoder for all the groups of word lines of this sector is on 1.

The signals Lx(a), Ly(b) vary according to the 5 most significant address bits A3–A7 and here comprise 8 signals Lx(0) to Lx(7) and 4 signals Ly(0) to Ly(3), allowing 32 different combinations of signals to be obtained, starting with the combination Lx(0)/Ly(0) and ending with the combination Lx(7)/Ly(3). Therefore, each combination of signals Lx(a), Ly(b) corresponds to one and only one group out of the 32 groups of the sector.

The predecoder PREDEC1 also supplies subgroup selection signals PDj that are applied to the subgroup decoder DECGEN, here 8 selection signals PD0 to PD7, and subgroup selection signals PSj that are applied to the subgroup decoder SPGEN, here 8 selection signals PS0 to PS7. These signals vary according to the 3 least significant address bits A8–A10.

The predecoder PREDEC1 comprises 8 predecode blocks PREDEC1(S0) to PREDEC1(S7), with one block per sector, each decode block being linked to a decode block of the decoder GPGEN described below. The signals supplied by the block PREDEC(S6) are partially represented on FIG. 3A.

Group Decoder GPGEN

The group decoder GPGEN comprises one decode block per sector, i.e. here 8 decode blocks GPGEN(S0) to GPGEN(S7). Each decode block comprises decode elements GPGENi in equal number to the number of groups of word lines per sector, i.e. here 32 decode elements GPGEN0 to GPGEN31. The decode elements of the block GPGEN(S6) are partially represented in FIG. 3A. Each decode element GPGENi of rank "i" supplies a selection signal GPi applied to all the word line drivers Di,j (Di,0 to Di,7) of the group of word lines GRPi of corresponding rank.

Each decode element GPGENi receives a combination of three selection signals Lx(a), Ly(b), LBS. For example, the decode element GPGEN0 of the block GPGEN(S6) receives the combination Lx(0)/Ly(0)/LBS(S6) and the decode element GPGEN31 receives the combination Lx(7)/Ly(3)/LBS(S6), the signal LBS being identical for all the word lines of the same sector. As the signals Lx(a), Ly(b) vary according to the 5 most significant address bits A3–A7, a single group decode element GPGENi in each decode block receives a combination of signals Lx(a)/Ly(b) equal to "11" (Vcc), and a single decode element GPGENi out of all the decode blocks receives a combination of signals Lx(a)/Ly(b)/LBS equal to "111".

Subgroup Decoder DECGEN

The subgroup decoder DECGEN comprises one decode block per sector, i.e. here 8 decode blocks DECGEN(S0) to DECGEN(S7). Each decode block comprises decode elements DECGENj in equal number to the number of subgroups of word lines per sector, i.e. here 8 decode elements DECGEN0 to DECGEN7. The decode elements of the block SPGEN(S6) are partially represented on FIG. 3A.

Each decode element DECGENj of rank j receives a selection signal PDj of corresponding rank and the signal LBS for selecting the corresponding sector. For example, the decode elements DECGEN0 and DECGEN7 of the block DECGEN(S6) respectively receive selection signals PD0 and PD7 and the signal LBS(S6). The selection signals PD0 to PD7 are common to all the blocks DECGEN(S0) to DECGEN(S7).

Each decode element DECGENj of rank j supplies selection signals DECj, DECNJ. These selection signals are applied to the word line drivers Di,j of the word lines belonging to the same subgroup of rank j. As the word lines of a same group GRPi each belong to a different subgroup, the word line drivers Di,j linked to these word lines each receive an individual combination of selection signals DECj, DECNj.

Subgroup Decoder SPGEN

The subgroup decoder SPGEN, of a general architecture similar to that of the subgroup decoder DECGEN, comprises one decode block per sector, i.e. here 8 decode blocks SPGEN(S0) to SPGEN(S7). Each decode block comprises decode elements SPGENj in equal number to the number of subgroups of word lines per sector, i.e. here 8 decode elements SPGEN0 to SPGEN7. The decode elements of the block SPGEN(S6) are partially represented on FIG. 3A.

Each decode element SPGENj of rank j receives a selection signal PSj of corresponding rank and the signal LBS for selecting the corresponding sector. For example, the decode elements SPGEN0 and SPGEN7 of the block SPGEN(S6) respectively receive selection signals PS0 and PS7 and the signal LBS(S6). The selection signals PS0 to PS7 are common to all the blocks SPGEN(S0) to SPGEN(S7).

Each decode element SPGENj of rank j supplies selection signals SPj, SPNj. These selection signals are applied to the word line drivers Di,j of the word lines belonging to the same subgroup of rank j. As the word lines of a same group GRPi each belong to a different subgroup, the word line drivers Di,j linked to these word lines each receive an individual combination of selection signals SPj, SPNj.

Word Line Driver Di,j

Contrary to the classical decoder described above, the word line drivers Di,j according to the present invention do not convert a selection signal of the type 0/Vcc into a negative or positive voltage depending on the operation performed in the memory array (read, erase, programming). The word line drivers are here simple multiplexers of signals the function of which is to combine the signals of variable polarity supplied by the group decode elements GPGENi and the subgroup decode elements DECGENj, SPGENj, i.e. the signals GPi, SPj and SPNj, DECj and DECNj, to obtain voltages Vi,j of variable polarity applied to the word lines WLi,j. The word line drivers can therefore be of a very simple structure.

Figure 4:
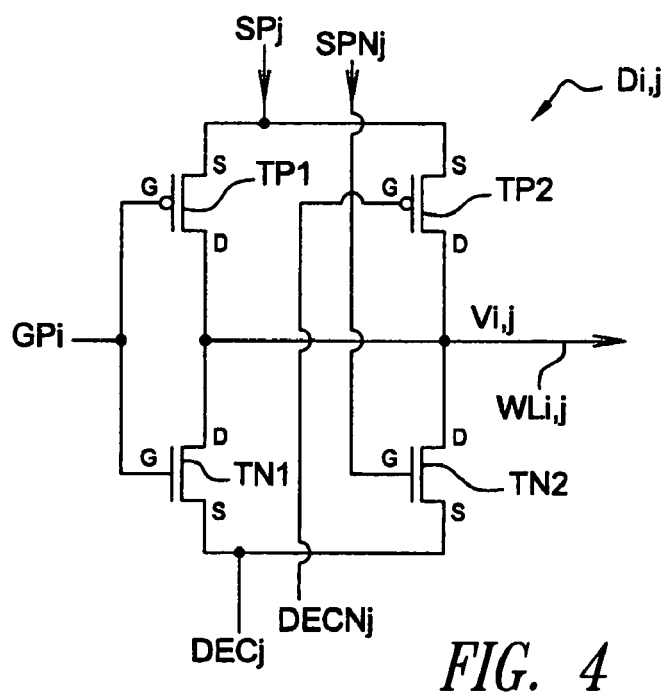
FIG. 4 represents the structure of a word line driver represented in block form in FIG. 3A, FIGS. 5A to 5L represent the word line driver in FIG. 4 in various configurations of operation.
Figure 5A:
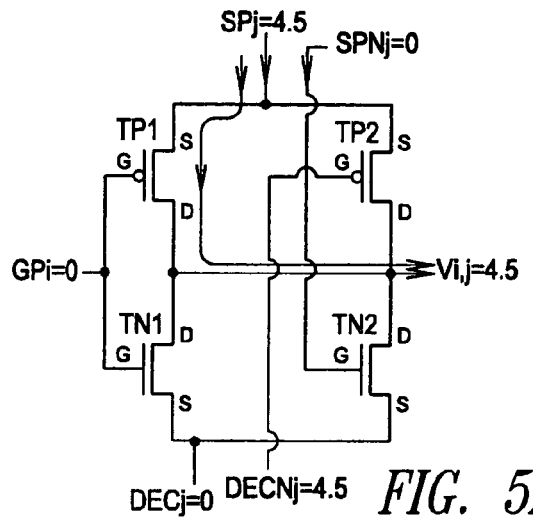
Figure 5B:
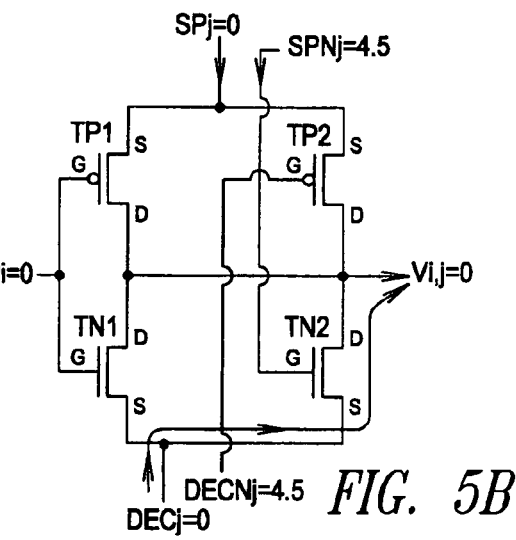
Figure 5C:
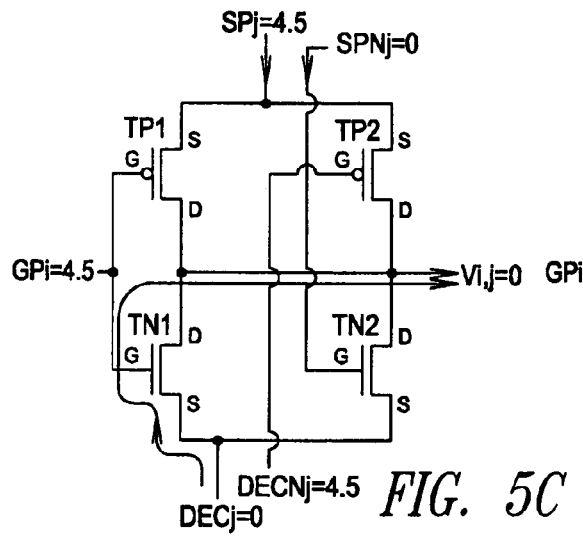
Figure 5D:
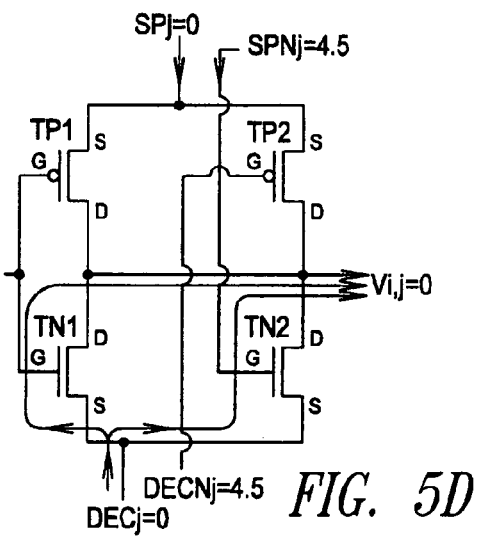
Figure 5E:
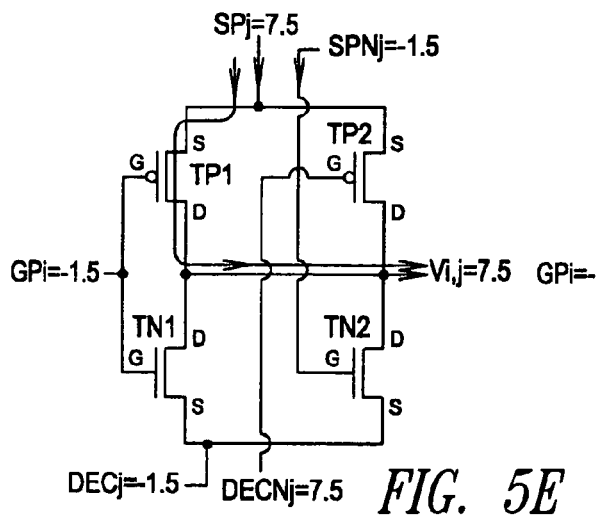
Figure 5F:
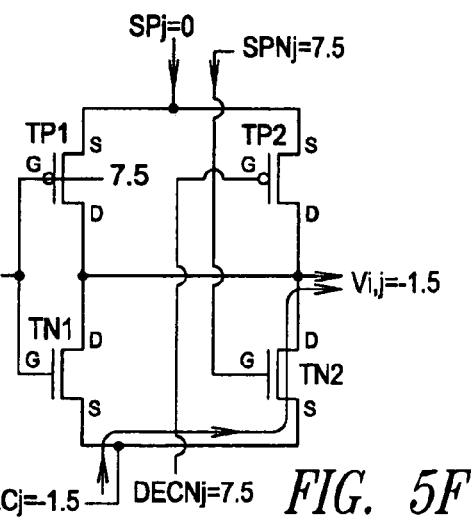
Figure 5G:
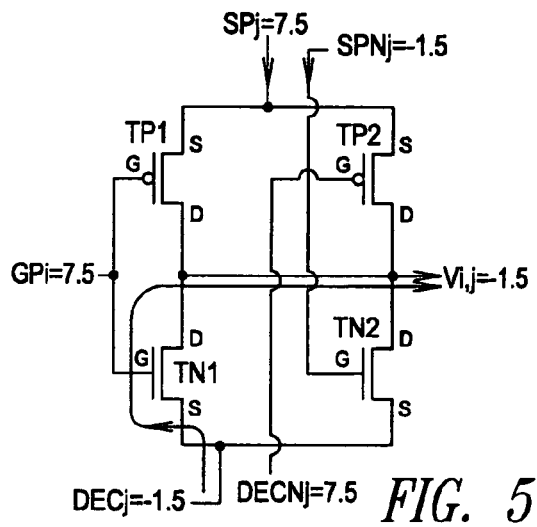
Figure 5H:
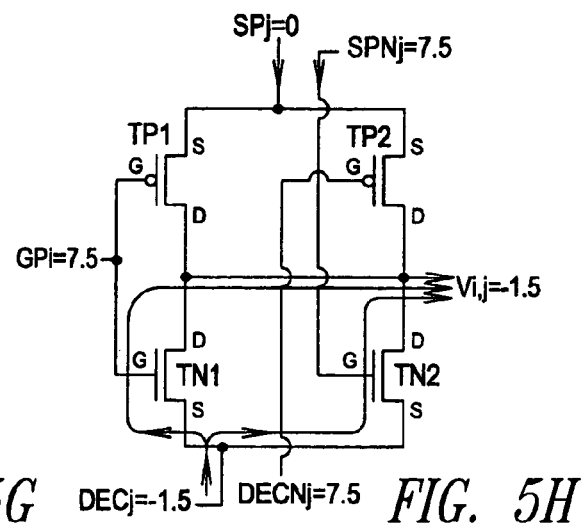
Figure 5I:
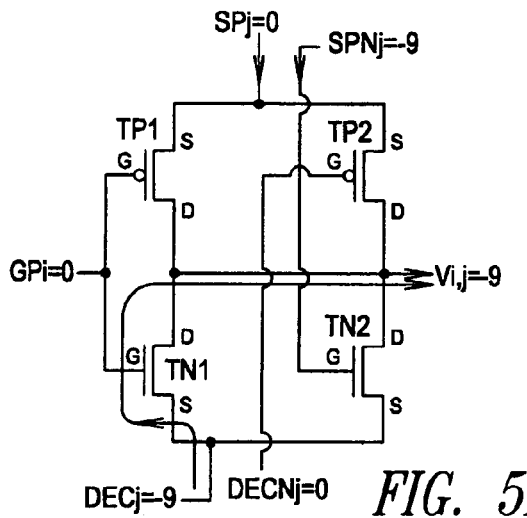
Figure 5J:
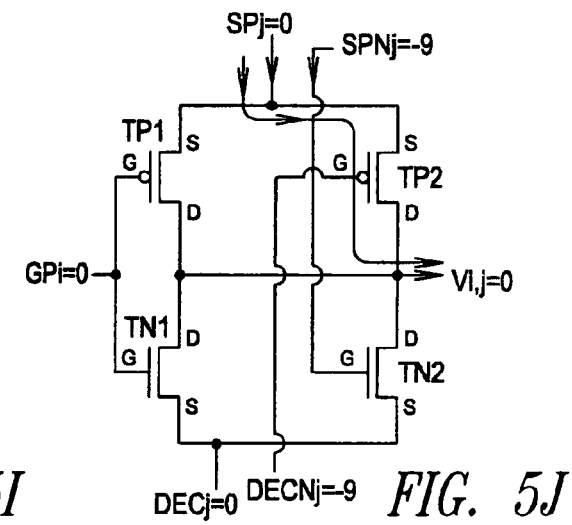
Figure 5K:
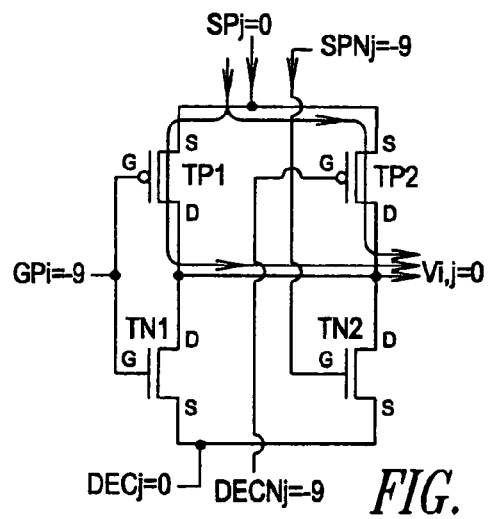
Figure 5L:
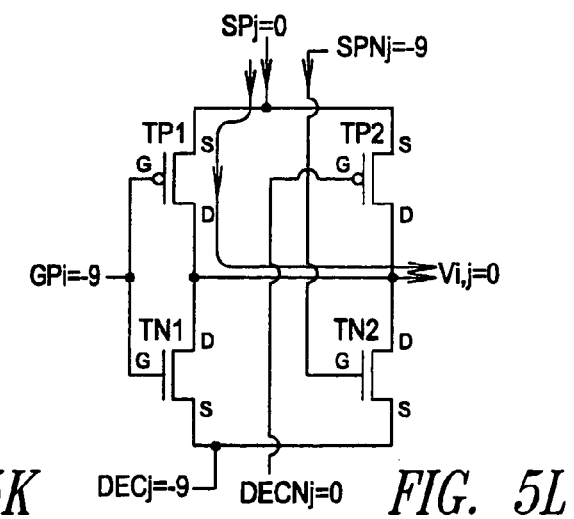

FIG. 4 represents an embodiment of a word line driver Di,j requiring a small number of transistors. The word line driver Di,j comprises two PMOS switch transistors TP1, TP2 and two NMOS switch transistors TN1, TN2 arranged to combine the signals GPi, SPj and SPNj, DECj and DECNj. The PMOS and NMOS transistors are implanted in different wells (respectively N-type wells and P-type wells) in a way that is within the understanding of those skilled in the art per se and will not be described here.

The transistors TP1, TP2 receive the signal SPj at their sources and the transistors TN1, TN2 receive the signal DECj at their sources. The gates of the transistors TP1, TN1 receive the signal GPi. The gate of the transistor TP2 receives the signal DECNj and the gate of the transistor TN2 receives the signal SPNj. The drains of the transistors TP1, TP2, TN1, TN2 are connected to an output node of the word line driver, which supplies the voltage Vi,j to the corresponding word line WLi,j.

The word line drivers Di,j are therefore compact and are adapted to the reduction of the technological pitch in the memories in integrated circuit. The negative or positive voltages are supplied by the group GPGEN and subgroup DECGEN, SPGEN decoders. As a result, the part of the decoder according to the present invention performing the postdecoding of the predecoding signals, here comprising the decoders GPGEN, DECGEN and SPGEN, is of a more complex structure than that of a positive voltage postdecoder, as it will be seen below. However, the surface of silicon available to produce the group and subgroup decoders is decidedly more extensive than that imposed by the technological pitch between the word lines, since each group or subgroup covers a set of word lines. The present invention is therefore based on a complexification of the part upstream from the decoder, to the benefit of a simplification of its part downstream, that is formed by the word line drivers.

To supply signals of variable polarity, the decoders GPGEN, SPGEN, DECGEN receive voltages VPOS and VNEG supplied by a voltage generator PWGEN controlled by a sequencer SEQ.

Voltage Generator PWGEN and Sequencer SEQ

Figure 3B:
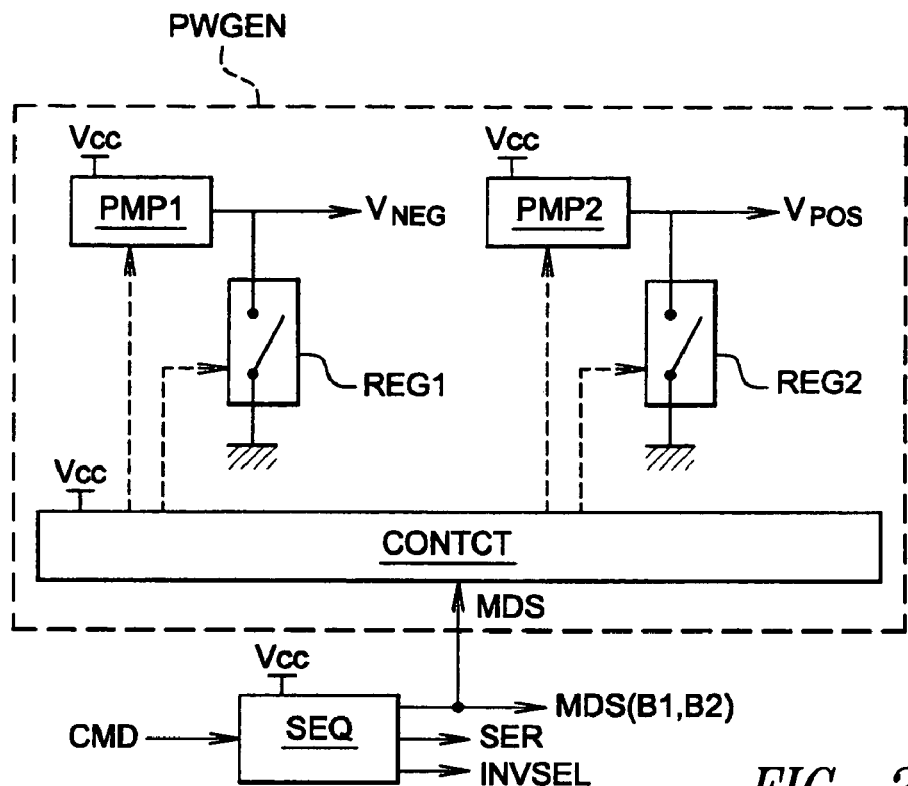
FIG. 3B represents a supply voltage generator represented in block form in FIG. 3A.

The generator PWGEN and the sequencer SEQ are represented in greater detail in FIG. 3B, that completes FIG. 3A. The generator PWGEN comprises a charge pump PMP1 delivering the voltage VNEG, a charge pump delivering the voltage VPOS, a regulator REG1 for controlling the voltage VNEG and a regulator REG2 for controlling the voltage VPOS. These various elements of the generator PWGEN are controlled by a control circuit CONTCT. The voltages VPOS, VNEG are applied to the decoders GPGEN, SPGEN, DECGEN.

The control circuit CONTCT is driven by a mode signal MDS that is supplied by the sequencer SEQ in response to a command CMD for reading or writing the memory array applied to the sequencer. The hard-wired logic or microprocessor sequencer SEQ, also supplies signals SES ("Sector Erase Signal") and INVSEL ("Inverse Selection"). The signals MDS, SES are applied to the predecoder PREDEC1. The signal INVSEL is applied to the group decoder GPGEN.

Operation of the Decoder WLDEC2

The operation of the decoder WLDEC2 is described by table 2 below. In this table, the following columns can be distinguished:

"Modes" Column

This column describes the operating modes of the memory. A mode READ corresponding to the reading of memory cells, a mode PROG corresponding to the programming of memory cells, a mode PERASE ("Page Erase") corresponding to the erasing of a page (word line) of the memory array, and a mode SERASE ("Sector Erase") corresponding to the erasing of an entire sector can be distinguished. The last erase mode is that of classical Flash memories that do not have a selective negative voltage decoder.

"SES" Column

This column describes the value of the signal SES ("Sector Erase Signal"). This signal determines whether an erase operation must be applied to an entire sector (mode SERASE) or only to one page of the memory array (mode PERASE). The signal SES is set to 1 in response to a sector erase command (mode SERASE) and to 0 in response to a page erase command (mode PERASE). Its default value is 0 in the modes PROG and READ.

"MDS" Column

This column describes the value of the mode signal MDS, that here comprises two bits B1, B2. The bit B1 is set to 1 when the voltage VNEG must be taken to a negative value and is set to 0 when the voltage VNEG must be set to 0 (ground). The bit B2 is set to 0 when the voltage VPOS must be taken to a positive value and is set to 1 when the voltage VPOS must be set to 0 (ground).

"INVSEL" Column

This column describes the value of the signal INVSEL ("Inverse Selection"), that is on 0 in the modes READ and PROG and on 1 in the modes PERASE and SERASE. The signal INVSEL allows the signals PDj to be inhibited in the modes READ and PROG and the signals PSj to be inhibited in the modes PERASE and SERASE. More particularly, the signals PDj are forced to 0 in the mode READ and are forced to 1 in the mode PROG, while the signals PSj are forced to 1 in the modes PERASE and SERASE. That allows the subgroup decoder DECGEN to be inhibited in the modes READ and PROG so as to take the signals DECj, DECNj to predetermined and fixed values described by table 2. That also allows the subgroup decoder SPGEN to be inhibited in the modes PERASE and SERASE so as to take the signals SPj, SPNj to predetermined and fixed values described by table 2.

"VNEG" Column

This column describes the value of the voltage VNEG in the four operating modes of the decoder. In the mode READ, the voltage VNEG is equal to a non-read voltage VNREAD that is here equal to 0V. In the mode PROG, the voltage VNEG is equal to a programming inhibit voltage VPINHIB that is here equal to −1.5V. In the mode PERASE and SERASE, the voltage VNEG is equal to a negative erase voltage VER that is here equal to −9V.

"VPOS" Column

This column describes the value of the voltage VPOS in the four operating modes of the decoder. In the mode READ, the voltage VPOS is equal to a read voltage VREAD that is here equal to 4.5V. In the mode PROG, the voltage VPOS is equal to a programming voltage VPP that is here equal to 7.5V. In the mode PERASE and SERASE, the voltage VPOS is equal to an erase inhibit voltage VEINHIB that is here equal to 0V.

"State" Column

This column describes the selected (SEL) or non-selected (UNS) state of a word line, according to the predecoding signals Lx(a), Ly(b), PSj, PDj supplied by the predecoder.

Columns "Lx(a)", "Ly(b)", "PSi", "PDj"

These columns describe, in the four operating modes of the decoder, examples of values of predecoding signals for selected or non-selected word lines. As indicated above, the signal PDj is forced to 0 in the mode READ and is forced to 1 in the mode PROG, while the signal PSj is forced to 1 in the modes PERASE and SERASE. A word line WLi,j is in the selected state when the corresponding predecoding signals Lx(a), Ly(b), PSj (modes READ, PROG) or Lx(a), Ly(b), PDj (modes PERASE, SERASE) are simultaneously on 1. The selection signal LBS is not described out of concern to remain simple, and it is considered that table 2 describes the operations occurring in a selected sector (LBS=1).

Columns "GPi", "SPi", "SPNi", "DECi", "DECNj"

These columns describe, in the four operating modes of the decoder, the values of the signals GPi, SPj, SPNj, DECj, DECNJ corresponding to the values of the predecoding signals Lx(a), Ly(b), PSj, PDj and to the values of the voltages VNEG and VPOS. These signals are expressed in Volts and correspond to the values allocated to the voltages VNEG and VPOS, i.e. VNREAD and VREAD in the mode READ, VPINHIB and VPP in the mode PROG, VER and VEINHIB in the modes PERASE and SERASE, that is here 0V and 4.5 V, −1.5V and 7.5V, −9V and 0V, respectively. The signals DECj and DECNj are forced to 0V and 4.5V in the mode READ as the predecoding signal PDj is forced to 0, and are forced to −1.5V and 7.5V in the mode PROG as the predecoding signal PDj is forced to 1. Similarly, the signals SPj and SPNj are forced to 0 and −9V in the modes PERASE and SERASE as the predecoding signal PSj is forced to 1.

It will be noted that the signal DECNj is the opposite of the signal DECj and that the signal SPNj is the opposite of the signal SPj, in a system of logic signals in which the voltages VNEG and VPOS respectively define the 0 and the logic 1.

"Vi,j" Column

This column describes the value of the voltage Vi,j applied to a selected or non-selected word line, in each of the operating modes. In the mode READ, a selected word line receives the read voltage VREAD (here 4.5V) while a non-selected line receives the non-read voltage VNREAD (here 0V). In the mode PROG, a selected word line receives the programming or refresh voltage VPP (here 7.5V) while a non-selected word line receives the programming inhibit voltage VPINHIB (here −1.5V) that protects the memory cells against a drain stress that can lead to spurious programming. In the mode PERASE, a selected word line (forming the page to be erased) receives the negative erase voltage VER (here −9V) while a non-selected word line receives the erase inhibit voltage VEINHIB (here 0V). This voltage protects the memory cells against a spurious erasure by reducing the source-gate voltage difference of the floating-gate transistors, as a positive voltage is applied to the sources of all the memory cells of the sector, as described in application WO 02/41322. In the mode PERASE, all the word lines of the selected sector receive the negative erase voltage VER while the word lines of the other sectors receive the erase inhibit voltage VEINHIB.

"FIGS. 5A–5L" Column

FIGS. 5A to 5L show the operation of a word line driver Di,j in each of the electrical configurations described by table 2, respectively. It can be seen on these Figures that the value of the signal Vi,j supplied to the word line depends on the combination of the signals GPi, SPj, SPNj, DECj, DECNj, one of the transistors TP1, TP2 TN1, TN2, sometimes two, being on and the others off, the transistor or transistors that are on forwarding one of the signals SPj, DECj through to the output node (the signals GPi, SPNj, DECNj here being used as gate control signals). The voltages applied to the P and N wells of the transistors are not represented out of concern to remain simple, except for the configuration in FIG. 5F in which it must be pointed out that a voltage of 7.5 V applied to the well of the transistor TP1 allows this transistor to be maintained in the off state.

In summary, the decoder according to the present invention allows word line drivers Di,j to be provided that are simple in structure and compatible with memories with a high density of word lines, for selectively applying negative or positive voltages to these word lines.

Some examples will now be described of embodiments of a group decode element GPGENi, of a subgroup decode element SPGENj and of a subgroup decode element DECGENj. In the following description, the NMOS type transistors are designated by reference signs starting with "TN" and the PMOS type transistors by reference signs starting with "TP".

Group Decode Element GPGENi

Figure 6:
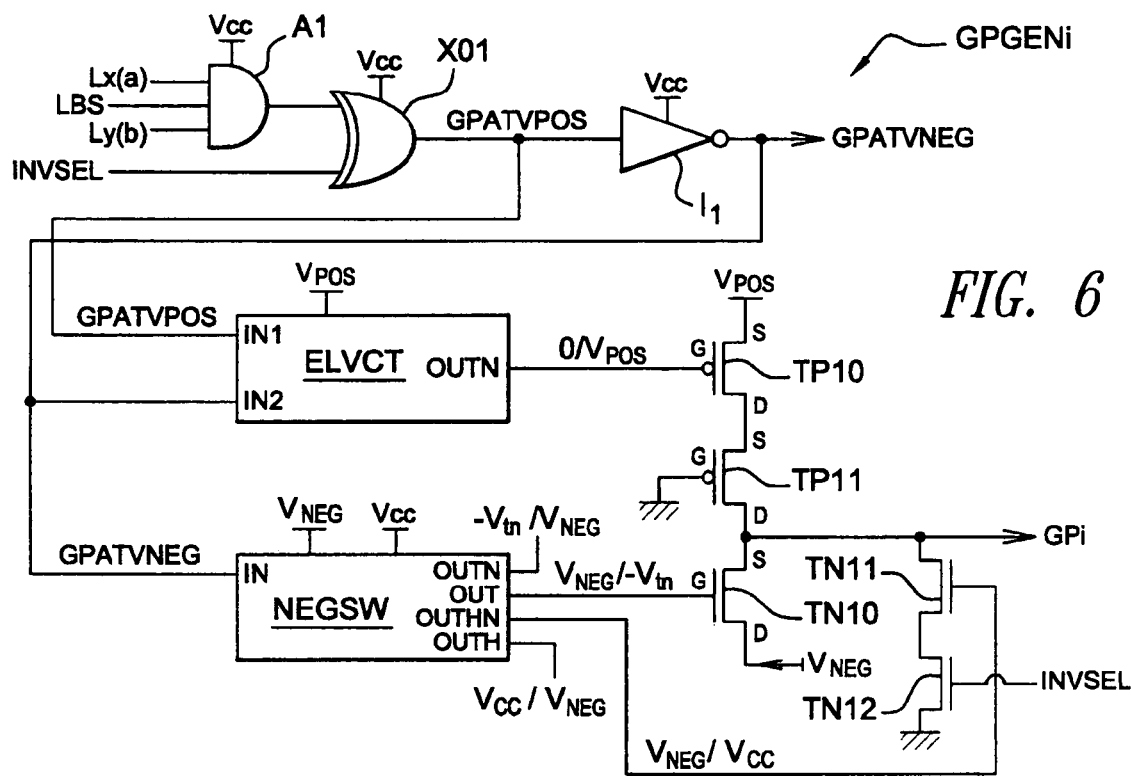
FIG. 6 represents the architecture of a group decoder represented in block form in FIG. 3A.

FIG. 6 represents an element GPGENi, supplying a group selection signal GPi. The element GPGENi comprises a gate A1 of AND type receiving the signals Lx(a), Ly(b), LBS at input, the output of which is applied to one input of a gate XO1 of Exclusive OR type, that receives the signal INVSEL at its other input. The output of the gate XO1 supplies a signal GPATVPOS ("GPi at VPOS") applied to an inverting gate I1 the output of which supplies a signal GPATVNEG ("GPi at VNEG"). These various logic gates are powered by the voltage Vcc and the logic signals GPATVPOS, GPATVNEG are of the ONcc type.

The element GPGEN also comprises a voltage elevator branch comprising a transistor TP10, a transistor TP11, and a transistor TN10 in series. The voltage VPOS is applied to the source of the transistor TP10 the drain of which is connected to the source of the transistor TP11. The drain of the transistor TP11 is connected to the drain of the transistor TN10 the source of which receives the voltage VNEG. The transistor TP11 is a cascode transistor the gate of which is for example linked to the ground.

The signal GPi is supplied by the drain node of the transistors TP11 and TN10, forming the output of the element GPGENi. This drain node is further linked to the ground by two transistors TN11, TN12 in series. The gate of the transistor TN12 is driven by the signal INVSEL.

The element GPGENi also comprises a voltage elevator circuit ELVCT powered by the voltage VPOS. The circuit ELVCT comprises an input IN1 receiving the signal GPATVPOS, an input IN2 receiving the signal GPATVNEG and an output OUTN that drives the gate of the transistor TP10. The output OUTN, which is an inverting output relative to the input IN1, delivers a signal equal to VPOS when the input IN1 is on 0, and a signal equal to 0 when the input IN1 is on 1 (Vcc) (refer to table 7 described below).

The element GPGENi also comprises a negative voltage selector switch circuit NEGSW powered by the voltages Vcc and VNEG. The circuit NEGSW comprises an input IN to which the signal GPATVNEG is applied, a non-inverting output OUT of low level that drives the gate of the transistor TN10, an inverting output OUTHN of high level that drives the gate of the transistor TN11. The circuit NEGSW also comprises an inverting output OUTN of low level and a non-inverting output OUTH of high level, not used here. The voltages delivered by these various outputs according to the signal applied to the input IN are described by table 8 below, some varying according to the operating mode of the memory.

The value of the selection signal GPi, equal to VPOS, VNEG or 0, varies according to the signals Lx(a), Ly(b), LBS, INVSEL, as described by table 2 and tables 3 and 4 below, in which it is considered that LBS=1. In the mode PERASE or SERASE (VPOS=0), the setting of the signal GPi to 0 is performed by the transistor TN11 when the output OUTHN of the circuit NEGSW changes to Vcc, as the signal INVSEL is on 1 and the transistor TN12 is on (refer to the last line of table 4).

Subgroup Decode Element DECGENi

Figure 7:
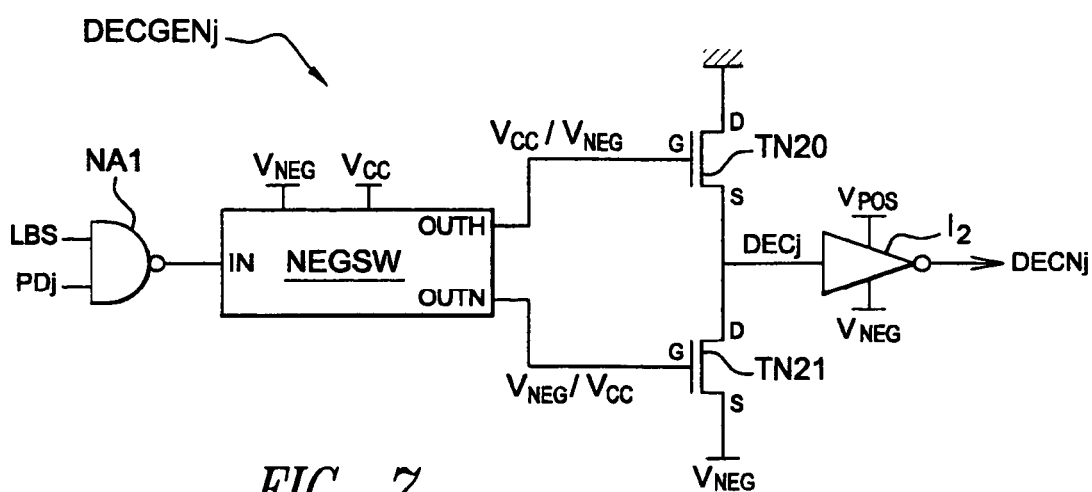
FIG. 7 represents the architecture of a first subgroup decoder represented in block form in FIG. 3A.

FIG. 7 represents a subgroup decode element DECGENj, supplying a subgroup selection signal DECj and its complement DECNj. The element DECGENj comprises a gate NA1 of NAND type powered by the voltage Vcc, receiving at input the signals LBS and PDj. The output of the gate NA1 is applied to the input IN of a negative voltage selector switch circuit NEGSW, conforming to the one described above and powered by the voltages Vcc and VNEG. The output OUTH of the circuit NEGSW is applied to the gate of a transistor TN20 the drain of which is connected to the ground. The output OUTN is applied to the gate of a transistor TN21 the source of which receives the voltage VNEG. The transistors TN20, TN21 are arranged in series and their drain node supplies the signal DECj. The signal DECNJ is supplied by an inverting gate I2 powered by the voltages VPOS and VNEG, the input of which receives the signal DECj. In the mode PERASE, the signal DECj is therefore equal to 0 or to VNEG (–9V) and the signal DECNj equal to 0 (VPOS=0) or to VNEG, according to the value of the signal PDj, as described by table 2 and table 5 below, in which it is assumed that LBS=1.

Subgroup Decode Element SPGENi

Figure 8:
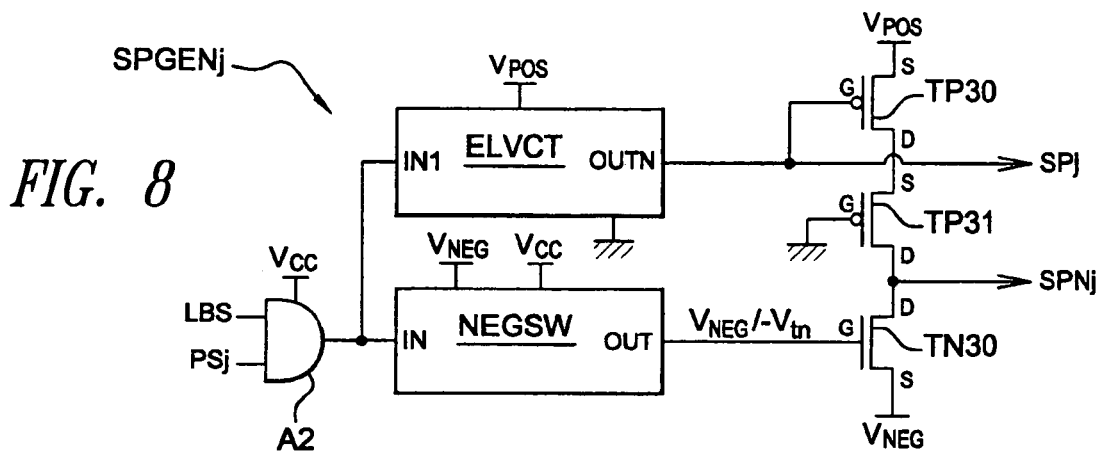
FIG. 8 represents the architecture of a second subgroup decoder represented in block form in FIG. 3A.

FIG. 8 represents a subgroup decode element SPGENj, supplying a subgroup selection signal SPj and its complement SPNj. The element SPGENj comprises a gate A2 of AND type powered by the voltage Vcc, receiving the signals LBS and PSj at input. The output of the gate A2 is applied to the input IN of a negative voltage selector switch circuit NEGSW of the type already described, powered by the voltages VNEG and Vcc, the output OUT of which drives the gate of a transistor TN30 receiving the voltage VNEG at its source. The output of the gate A2 is also applied to the input IN1 of a voltage elevator circuit ELVCT of the type already described, powered by the voltage VPOS, the output OUTN of which supplies the signal SPj. The signal SPj is applied to the gate of a transistor TP3 the source of which receives the voltage VPOS. The drain of the transistor TP30 is connected to the source of a cascode transistor TP31 the gate of which is linked to the ground. The drain of the transistor TP31 is linked to the drain of the transistor TN30. The signal SPNj is taken off at the drain node of the transistors TP31, TN30.

In the mode READ or PROG, the signal SPj is therefore equal to 0 or to VPOS (with VPOS=VREAD or VPP) and the signal DECNj is equal to VPOS or VNEG (with VNEG=VNREAD or VPINHIB), according to the value of the signal PSj, as described by table 2 and table 6 below, in which it is assumed that LBS=1.

Voltage Elevator Circuit ELVCT

Figure 9:
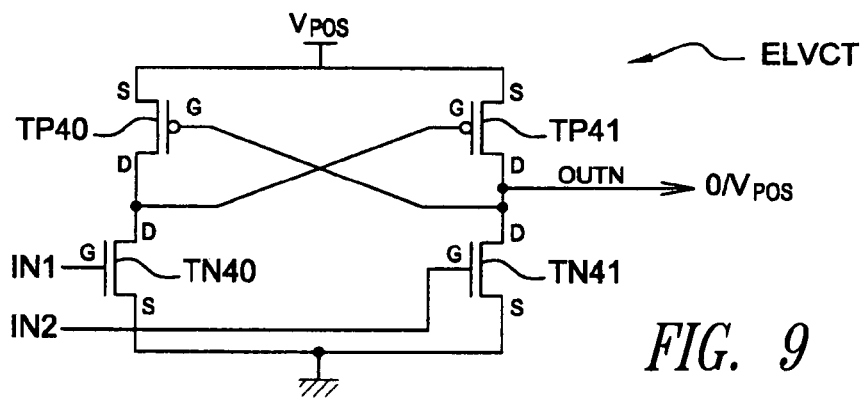
FIG. 9 is the wiring diagram of a voltage elevator circuit represented in block form in FIG. 6.

FIG. 9 represents an example of an embodiment of the voltage elevator circuit ELVCT. The circuit ELVCT comprises two branches in parallel each comprising two transistors in series, respectively TP40, TN40 and TP41, TN41, the sources of the transistors TP40, TP41 receiving the voltage VPOS and the sources of the transistors TN40, TN41 being connected to the ground. The gate of the transistor TP40 is connected to the drain of the transistor TP41 the gate of which is connected to the drain of the transistor TP40. The gate of the transistor TN41 forms the input IN1 and the gate of the transistor TN40 forms the input IN2 of the circuit ELVCT. The drain node of the transistors TP41, TN41 forms the output OUTN of the circuit ELVCT. The output OUTN supplies a signal equal to VPOS when the input IN1 receives a signal equal to 0V and the input IN2 receives a signal equal to Vcc, and supplies a signal equal to 0V when the input IN1 receives a signal equal to Vcc and the input IN2 receives a signal equal to 0V. The circuit ELVCT forms a sort of flip-flop locking the output OUTN while performing a voltage elevation of the logic level 1, as described by table 7 below.

Negative Voltage Selector Switch NEGSW

Figure 10:
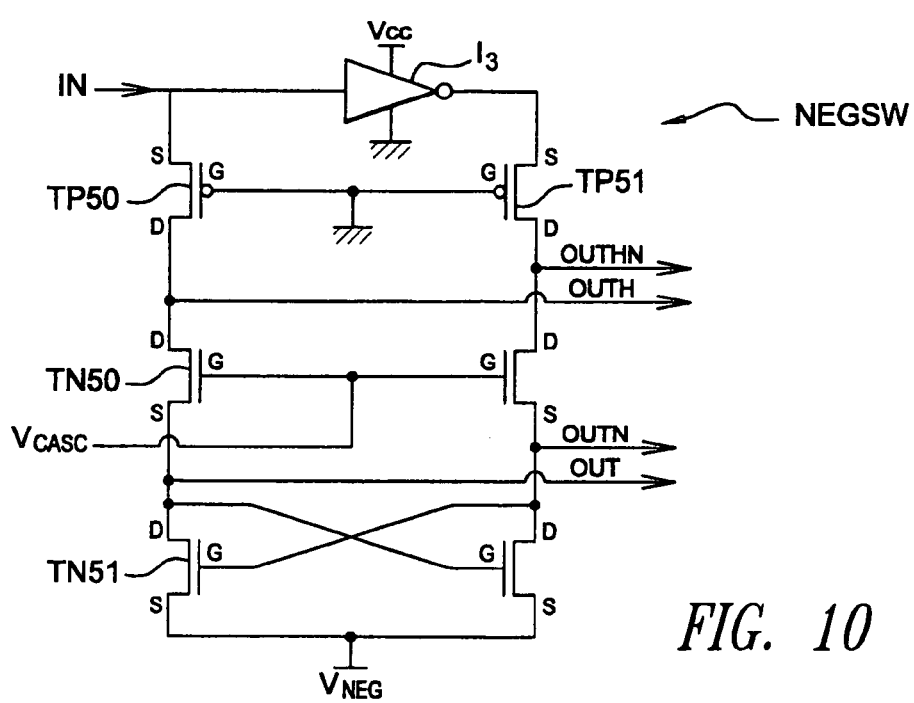
FIG. 10 is the wiring diagram of a negative voltage selector switch represented in block form in FIGS. 6, 7 and 8.

FIG. 10 represents an example of an embodiment of the negative voltage selector switch NEGSW. The latter comprises two branches in parallel each comprising three transistors, respectively TP50, TN50, TN51 and TP51, TN52, TN53. The input IN of the selector switch NEGSW is connected to the source of the transistor TP50 and is linked to the source of the transistor TP51 through an inverting gate 13 powered by the voltage Vcc. The drain of the transistor TP50 is connected to the drain of the transistor TN50. The source of the transistor TN50 is linked to the drain of the transistor TN51 the source of which receives the voltage VNEG. The, drain of the transistor TP51 is connected to the drain of the transistor TN52. The source of the transistor TN52 is linked to the drain of the transistor TN53 the source of which receives the voltage VNEG. The transistors TP50, TP51 are cascode transistors and have their gates linked to the ground. The transistors TN50, TN52 are also cascode transistors and their gates are biased by a voltage VCASC. The gate of the transistor TN53 is connected to the drain of the transistor TN51 and the gate of the transistor TN51 is linked to the drain of the transistor TN53.

The low level output OUT of the negative voltage selector switch is connected to the drain of the transistor TN51 and the low level inverting output OUTN is connected to the drain of the transistor TN53. The high level output OUTH is connected to the drain of the transistor TP51 and the high level inverting output OUTHN is connected to the drain of the transistor TP51. When the voltage Vcc is applied to the input IN the transistor TN51 is on and the transistor TN53 is off. When the input IN is set to 0 the transistor TN51 is off, the output of the gate 13 supplies the voltage Vcc and the transistor TN53 is on. The selector switch NEGSW therefore operates like a sort of flip-flop that switches in one direction when the input IN receives the voltage Vcc, and in the other direction when the input IN receives a zero voltage. The voltages delivered by the outputs OUT, OUTN, OUTH, OUTHN are described by table 8 below. It will be noted that the voltages delivered by the low level outputs OUT, OUTN depend on the value of the voltage VCASC and that the latter has different values according to the operating mode of the memory. The voltage VCASC is therefore equal to VPOS in the operating modes READ and PROG (i.e. when the voltage VNEG is equal to 0 or to −1.5V) and is equal to 0 in the operating modes PERASE, SERASE (i.e. when the voltage VNEG is equal to VERASE).

It will be understood by those skilled in the art that various alternative embodiments of the word line decoder that has just been described may be made, particularly as far as the production of the word line drivers, the group decoders and the subgroup decoders are concerned, without departing from the scope of the present invention.

TABLE 2

| Modes | Control signals | | | Voltages | | State |
| --- | --- | --- | --- | --- | --- | --- |
| | SES | MDS (B1B2) | INVSEL | VNEG | VPOS | WLi, j |
| READ | 0 | 00 | 0 | VNEG = VNREAD VNREAD = 0 V | VPOS = VREAD VREAD = 4.5 V | SEL UNS UNS UNS |
| PROG | 0 | 10 | 0 | VNEG = VPINHIB VPINHIB = −1.5 V | VPOS = VPP VPP = 7.5 V | SEL UNS UNS |
| PERASE | 0 | 11 | 1 | VNEG = VER VER = −19 V | VPOS = VEINHIB VEINHIB = 0 V | SEL UNS UNS |
| SERASE | 1 | 11 | 0 | idem | idem | SEL |

| | Predecoding | | | | Postdecoding | | | | | Multiplexing | |
| --- | --- | --- | --- | --- | --- | --- | --- | --- | --- | --- | --- |
| | | | | | GPi | SPj | SPNj | DECj | DECNj | Vi, | FIG. |
| Modes | LXi | LYi | PSj | PDj | (V) | (V) | (V) | (V) | (V) | j | 5A–5L |
| READ | 1 | 1 | 1 | 0 | 0 | 4.5 | 0 | 0 | 4.5 | 4.5 | 5A |
| | 1 | 1 | 0 | 0 | 0 | 0 | 4.5 | 0 | 4.5 | 0 | 5B |
| | 0 | 0 | 1 | 0 | 4.5 | 4.5 | 0 | 0 | 4.5 | 0 | 5C |
| | 0 | 0 | 0 | 0 | 4.5 | 0 | 4.5 | 0 | 4.5 | 0 | 5D |

TABLE 2-continued

| PROG | 1 | 1 | 1 | 1 | −1.5 | 7.5 | −1.5 | −1.5 | 7.5 | 7.5 | 5E |
|---|---|---|---|---|---|---|---|---|---|---|---|
|  | 1 | 1 | 0 | 1 | −1.5 | 0 | 7.5 | −1.5 | 7.5 | −1.5 | 5F |
|  | 0 | 0 | 1 | 1 | 7.5 | 7.5 | −1.5 | −1.5 | 7.5 | −1.5 | 5G |
|  | 0 | 0 | 0 | 1 | 7.5 | 0 | 7.5 | −1.5 | 7.5 | −1.5 | 5H |
| PERASE | 1 | 1 | 1 | 1 | 0 | 0 | −9 | −9 | 0 | −9 | 5I |
|  | 1 | 1 | 1 | 0 | 0 | 0 | −9 | 0 | −9 | 0 | 5J |
|  | 0 | 0 | 1 | 1 | −9 | 0 | −9 | 0 | −9 | 0 | 5K |
|  | 0 | 0 | 1 | 1 | −9 | 0 | −9 | −9 | 0 | 0 | 5L |
| SERASE | 0 | 0 | 1 | 1 | 0 | 0 | 0 | −9 | 0 | −9 |  |

TABLE 3

(group decode element GPGENi)

| Lx(a) AND Ly(b) | INVSEL | GPATVPOS | GPATVNEG |
|---|---|---|---|
| 0 | 0 | 0 | 1 |
| 0 | 1 | 1 | 0 |
| 1 | 0 | 1 | 0 |
| 1 | 1 | 0 | 1 |

TABLE 7

(voltage elevator circuit ELVCT)

| IN1 (ELVCT) | IN2 (ELVCT) | OUTN (ELVCT) |
|---|---|---|
| 0 (0 V) | 1 (Vcc) | 1 (VPOS) |
| 1 (Vcc) | 0 (0 V) | 0 (0 V) |

TABLE 4

(group decode element GPGENi)

| INVSEL | GPATVPOS IN1 (ELVCT) | GPATVNEG IN (NEGSW) IN2 (ELVCT) | OUTN (ELVCT) | OUT (NEGSW) | OUTHN (NEGSW) | Gpi |
|---|---|---|---|---|---|---|
| 0 | 0 | 1 | 1 (VPOS) | 1 (Vcc) | 0 (NVEG) | VNEG |
| 0 | 1 | 0 | 0 (0 V) | 0 (VNEG) | 1 (Vcc) | VPOS |
| 1 | 0 | 1 | 1 (VPOS) | 1 (−Vtn) | 0 (VNEG) | VNEG |
| 1(Vcc) | 1 | 0 | 0 (0 V) | 0 (VNEG) | 1(Vcc) | 0 |

TABLE 5

(subgroup decode element DECGENj)

| PDj IN (NEGSW) | OUTH (NEGSW) | OUTN (NEGSW) | DECj | DECNj |
|---|---|---|---|---|
| 0 (0 V) | 0 (VNEG) | 1 (−Vtn) | VNEG | VPOS |
| 1 (Vcc) | 1 (Vcc) | 0 (VNEG) | 0 V | X (*) |

(*) X = VPOS if VNEG = 0 (mode READ) X-VNEG if VPOS = 0 (mode PERASE).

TABLE 8

(negative voltage selector switch NEGSW)

| Modes | IN (NEGSW) | OUT (NEGSW) | OUTN (NEGSW) | OUTH (NEGSW) | OUTHN (NEGSW) |
|---|---|---|---|---|---|
| ERASE/ | 1 (Vcc) | 1 (−Vtn) | 0 (VNEG) | 1 (Vcc) | 0 (VNEG) |
| SERASE (*) | 0 (0 V) | 0 (VNEG) | 1 (−Vtn) | 0 (VNEG) | 1 (Vcc) |
| READ/ | 1 (Vcc) | 1 (Vcc) | 0 (VNEG) | 0 (VNEG) | 1 (Vcc) |
| PROG (**) | 0 (0 V) | 0 (VNEG) | 1 (Vcc) | 0 (VNEG) | 1 (Vcc) |

(*) VCASC = 0
(**) VCASC = VPOS

TABLE 6

(subgroup decode ELEMENT SPGENj)

| VNEG | PSj | IN (NEGSW) | OUT (NEGSW) | SPj | SPNj |
|---|---|---|---|---|---|
| VNREAD (0 V) or VPINHIB (−1.5 V) | 0 (0 V) | 0 (0 V) | VNEG | 0 (0 V) | 1 (VPOS) |
| VNREAD (0 V) or VPINHIB (−1.5 V) | 1 (Vcc) | 1 (Vcc) | Vcc | 1 (VPOS) | 0 (VNEG) |
| VER (−9 V) | 0 (0 V) | 0 (0 V) | VNEG | 0 V | 0 V |
| VER (−9 V) | 1 (Vcc) | 1 (Vcc) | −Vtn | 0 V | 0 V |

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An address decoder for selectively applying to word lines of a memory array signals of variable polarity, negative or positive, each signal having a value that varies according to a word line address applied to the decoder, the address decoder comprising:
a group decoder delivering group selection signals of variable polarity for selecting a group of word lines from a plurality of groups of word lines;
at least one subgroup decoder delivering subgroup selection signals of variable polarity for selecting a subgroup of word lines from a plurality of subgroups of word lines, each subgroup of word lines comprising a set of word lines belonging to different groups of word lines; and
word line drivers with one word line driver per word line, each comprising means for multiplexing the group and subgroup selection signals, for selecting and selectively applying one of these signals to a word line.

2. The decoder according to claim 1 wherein:
each group of word lines comprises a respective set of word lines having address bits of identical determined significance; and
each subgroup of word lines comprises a respective set of word lines having address bits of identical determined significance, while belonging to different groups of word lines.

3. The decoder according to claim 2 wherein each group of word lines comprises a set of word lines having identical most significant address bits, and each subgroup of word lines comprises a set of word lines having identical least significant address bits.

4. The decoder according to claim 1 wherein each word line driver comprises MOS-type switch transistors which are both driven on their gate and biased on their drain and their source by the group and subgroup selection signals, and are arranged for selecting one of these signals and for applying it to a word line.

5. The decoder according to claim 4 wherein each word line driver comprises switch transistors each having:
a terminal linked to a word line;
a terminal receiving one of the group or subgroup selection signals; and
a gate receiving another of the group or subgroup selection signals.

6. The decoder according to claim 1 wherein the subgroup decoder comprises:
a first subgroup decoder, delivering first subgroup selection signals having values that vary according to the word line address applied to the address decoder during a phase of erasing memory cells, and is independent of the address applied to the address decoder during phases of reading or programming memory cells; and
a second subgroup decoder delivering second subgroup selection signals having values that vary according to the word line address applied to the address decoder during the phases of reading or programming, and is independent of the address applied to the address decoder during the phase of erasing.

7. The decoder according to claim 6 wherein each of the subgroup decoders receives a first and a second reference voltage and supplies, in addition to a subgroup selection signal, a complementary subgroup selection signal equal to the second reference voltage when the subgroup selection signal is equal to the first reference voltage and equal to the first reference voltage when the subgroup selection signal is equal to the second reference voltage.

8. The decoder according to claim 7 wherein each word line driver comprises:
first MOS transistors having gates that are driven by one of the complementary signals; and
second MOS transistors having gates that are driven by group selection signals.

9. The decoder according to claim 7 wherein each word line driver comprises:
a first MOS transistor having a drain or source terminal linked to a word line, receiving a group selection signal at its gate and receiving a first subgroup selection signal at a source or drain terminal;
a second MOS transistor having a drain or source terminal linked to the word line, receiving the group selection signal at its gate and receiving a second subgroup selection signal at a source or drain terminal;
a third MOS transistor having a drain or source terminal linked to the word line, receiving a first complementary subgroup selection signal at its gate and receiving a second subgroup selection signal at a source or drain terminal; and
a fourth MOS transistor having a drain or source terminal linked to the word line, receiving a second complementary subgroup selection signal at its gate and receiving a first subgroup selection signal at a source or drain terminal.

10. The decoder according to claim 1 wherein the group and subgroup decoders receive two reference voltages that are respectively equal to a non-read voltage and a read voltage during reading of memory cells of the memory array.

11. The decoder according to claim 1 wherein the group and subgroup decoders receive two reference voltages that are respectively equal to a programming inhibit voltage and a programming voltage during programming of memory cells of the memory array.

12. The decoder according to claim 1 wherein the group and subgroup decoders receive two reference voltages that are respectively equal to an erase voltage and to an erase inhibit voltage during erasing of memory cells of the memory array.

13. The decoder according to claim 1 wherein:
the group and subgroup decoders receive two reference voltages that are respectively equal to a non-read voltage and a read voltage during reading of memory cells of the memory array;
the group and subgroup decoders receive two reference voltages that are respectively equal to a programming inhibit voltage and a programming voltage during programming of the memory cells;
the group and subgroup decoders receive two reference voltages that are respectively equal to an erase voltage and to an erase inhibit voltage during erasing of the memory cells; and
the programming voltage is positive, the programming inhibit voltage and the erase voltage are negative, the non-read and erase inhibit voltages are zero.

14. The decoder according to claim 1 comprising a predecode stage supplying predecoding signals to the group and subgroup decoders.

15. The decoder according to claim 1 wherein the group decoder and the subgroup decoder supply positive, negative, and zero selection signals.

16. The decoder according to claim 1 wherein the group decoder comprises voltage elevator circuits for transforming a logic signal equal to 1, having a determined positive level of voltage, into a logic signal having a higher positive level of voltage, equal to a reference voltage supplied to the voltage elevator circuits.

17. The decoder according to claim 1 wherein the group and subgroup decoders comprise voltage selector switches for transforming logic signals on 0 and on 1 into signals having different negative levels of voltage.

18. The decoder according to claim 1 wherein the group and subgroup decoders comprise voltage selector switches arranged for transforming a logic signal on 0 into a negative voltage signal and a logic signal on 1 into a positive voltage signal.

19. A memory device, comprising:
a memory array having memory elements arranged in a plurality of rows that are controlled by a corresponding plurality of word lines; and
an address decoder for selectively applying to the word lines of the memory array signals that are negative during a first phase and positive during a second phase, each signal having a value that varies according to a word line address applied to the decoder, the address decoder comprising:
a group decoder delivering negative and positive group selection signals for selecting a group of the word lines from a plurality of groups of the word lines;
a first subgroup decoder delivering negative and positive subgroup selection signals for selecting a subgroup of the word lines from a plurality of subgroups of the word lines, each of the subgroups of word lines comprising a set of word lines belonging to different groups of word lines; and
a plurality of word line drivers connected to the plurality of word lines, respectively, such that each word line driver corresponds to a respective one of the word lines, each word line driver being structured to drive the corresponding word lines based on the group and subgroup selection signals.

20. The memory device of claim 19 wherein:
each group of word lines comprises a respective set of word lines having address bits of identical determined significance; and
each subgroup of word lines comprises a respective set of word lines having address bits of identical determined significance, while belonging to different groups of word lines.

21. The memory device of claim 19 wherein each word line driver comprises MOS-type switch transistors having respective gates driven by one of the group selection signals, respective first conduction terminals bias by respective subgroup selection signals, and respective second conduction terminals connected to each other and to the corresponding word line.

22. The memory device of claim 19 wherein the subgroup decoder comprises:
a first subgroup decoder connected to first and second reference voltages and structured to provide a first subgroup selection signal equal to one of the first and second reference voltages and a complementary first subgroup selection signal that is a complement of the first subgroup selection signal; and
a second subgroup decoder connected to the first and second reference voltages and structured to provide a first subgroup selection signal equal to one of the first and second reference voltages and a complementary first subgroup selection signal that is a complement of the first subgroup selection signal, wherein each word line driver includes:
a first MOS transistor having a gate connected to the group decoder, a first conduction terminal connected to receive the first subgroup selection signal from the first subgroup decoder, and a second conduction terminal connected to the corresponding word line;
a second MOS transistor having a gate connected to the group decoder, a first conduction terminal connected to receive the second subgroup selection signal from the second subgroup decoder, and a second conduction terminal connected to the corresponding word line;
a third MOS transistor having a gate connected to receive the complementary second subgroup selection signal from the second subgroup decoder, a first conduction terminal connected to receive the first subgroup selection signal from the first subgroup decoder, and a second conduction terminal connected to the corresponding word line; and
a fourth MOS transistor having a gate connected to receive the complementary first subgroup selection signal from the first subgroup decoder, a first conduction terminal connected to receive the second subgroup selection signal from the first subgroup decoder, and a second conduction terminal connected to the corresponding word line.

23. The memory device of claim 19 wherein the group decoder and the subgroup decoder supply positive, negative, and zero selection signals.

24. The memory device of claim 19 wherein the group decoder comprises a voltage elevator circuit for transforming a logic signal equal to 1, having a determined positive level of voltage, into a logic signal having a higher positive level of voltage, equal to a reference voltage supplied to the voltage elevator circuit.

25. The memory device of claim 19 wherein the group and subgroup decoders comprise voltage selector switches for transforming logic signals 0 and 1 into signals having different negative levels of voltage.

26. The memory device of claim 19 wherein the group and subgroup decoders comprise voltage selector switches arranged for transforming a logic signal 0 into a negative voltage signal and a logic signal 1 into a positive voltage signal.

27. A line decoder for selectively applying to a line of a memory array signals of variable polarity, negative or positive, the decoder comprising:
a first MOS transistor having a gate connected to receive a control signal, a first conduction terminal connected to receive a first selection voltage, and a second conduction terminal connected to the line of the memory array;
a second MOS transistor having a gate connected to the gate of the first MOS transistor, a first conduction terminal connected to receive a second selection voltage, and a second conduction terminal connected to the line of the memory array;
a third MOS transistor having a gate connected to receive a complementary second selection voltage that is complementary to the second selection voltage, a first conduction terminal connected to first conduction terminal of the first MOS transistor, and a second conduction terminal connected to the line of the memory array; and a fourth MOS transistor having a gate connected to receive a complementary first selection voltage that is complementary to the first selection voltage, a first conduction terminal connected to the first conduction terminal of the second MOS transistor, and a second conduction terminal connected to the line of the memory array.

28. A method of selectively applying to word lines of a memory array signals of variable polarity, negative or positive, each signal having a value that varies according to a word line address, the method comprising:

delivering group selection signals of variable polarity for selecting a group of word lines from a plurality of groups of word lines;

delivering subgroup selection signals of variable polarity for selecting a subgroup of word lines from a plurality of subgroups of word lines, one of the subgroups of word lines comprising a set of word lines belonging to different groups of word lines; and multiplexing the group and subgroup selection signals to select and selectively apply one of these signals to one of the word lines.

29. The method of claim 28 wherein:

each group of word lines comprises a respective set of word lines having address bits of identical determined significance; and each subgroup of word lines comprises a respective set of word lines having address bits of identical determined significance, while belonging to different groups of word lines.

30. The method of claim 28 wherein each group of word lines comprises a set of word lines having identical most significant address bits, and each subgroup of word lines comprises a set of word lines having identical least significant address bits.

31. The method of claim 28 wherein delivering subgroup selection signals comprises:

delivering first subgroup selection signals having values that vary according to the word line address applied during a phase of erasing memory cells, and is independent of the address applied during phases of reading or programming memory cells; and delivering second subgroup selection signals having values that vary according to the word line address applied during the phases of reading or programming, and is independent of the address applied during the phase of erasing.

32. The method of claim 28, further comprising transforming a logic signal of value 0 into a negative voltage signal and a logic signal of value 1 into a positive voltage signal.

33. The line decoder of claim 27 wherein the first and third MOS transistors are of a first conductivity type and the second and third MOS transistors are of a second conductivity type.

34. An address decoder for selectively applying signals to word lines of a memory array, each signal having a value that varies according to a word line address applied to the decoder, the address decoder comprising:

a group decoder delivering group selection signals for selecting a group of word lines from a plurality of groups of word lines;

a subgroup decoder delivering subgroup selection signals for selecting a subgroup of word lines from a plurality of subgroups of word lines, each subgroup of word lines comprising a set of word lines belonging to different groups of word lines; and plural word line drivers with each word line driver being connected to a corresponding one of the word lines, respectively, each word line driver including a multiplexer that multiplexes the group and subgroup selection signals, for selecting and selectively applying one of these signals to the corresponding word line.

35. The decoder according to claim 34 wherein:

each group of word lines comprises a respective set of word lines having address bits of identical determined significance; and each subgroup of word lines comprises a respective set of word lines having address bits of identical determined significance, while belonging to different groups of word lines.

36. The decoder according to claim 34 wherein each word line driver comprises MOS-type switch transistors having respective gates driven by one of the group selection signals, respective first conduction terminals bias by respective subgroup selection signals, and respective second conduction terminals connected to each other and to the corresponding word line.

37. The decoder according to claim 34 wherein the subgroup decoder comprises:

a first subgroup decoder, delivering first subgroup selection signals having values that vary according to the word line address applied to the address decoder during a phase of erasing memory cells, and is independent of the address applied to the address decoder during phases of reading or programming memory cells; and a second subgroup decoder delivering second subgroup selection signals having values that vary according to the word line address applied to the address decoder during the phases of reading or programming, and is independent of the address applied to the address decoder during the phase of erasing.

38. The decoder according to claim 34 wherein each word line driver comprises:

a first MOS transistor having a gate connected to the group decoder, a first conduction terminal connected to receive a first subgroup selection signal, and a second conduction terminal connected to the corresponding word line;

a second MOS transistor having a gate connected to the group decoder, a first conduction terminal connected to receive a second subgroup selection signal, and a second conduction terminal connected to the corresponding word line;

a third MOS transistor having a gate connected to receive a complementary second subgroup selection signal, a first conduction terminal connected to receive the first subgroup selection signal, and a second conduction terminal connected to the corresponding word line; and a fourth MOS transistor having a gate connected to receive a complementary first subgroup selection signal, a first conduction terminal connected to receive the second subgroup selection signal, and a second conduction terminal connected to the corresponding word line.

* * * * *